United States Patent
Kim et al.

(10) Patent No.: US 7,671,427 B2
(45) Date of Patent: Mar. 2, 2010

(54) METHOD OF MANUFACTURING FILM BULK ACOUSTIC RESONATOR USING INTERNAL STRESS OF METALLIC FILM AND RESONATOR MANUFACTURED THEREBY

(75) Inventors: Jong-seok Kim, Gyeonggi-do (KR); Sung-hoon Choa, Seoul (KR); In-sang Song, Seoul (KR); Young-tack Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 408 days.

(21) Appl. No.: 10/838,326

(22) Filed: May 5, 2004

(65) Prior Publication Data

US 2005/0001274 A1    Jan. 6, 2005

(30) Foreign Application Priority Data

May 22, 2003    (KR) ................. 10-2003-0032651

(51) Int. Cl.
*H01L 47/00* (2006.01)
(52) U.S. Cl. ............... 257/414; 257/4; 257/E29.001
(58) Field of Classification Search .......... 438/48; 257/414, 4, E29.001
See application file for complete search history.

(56) References Cited

U.S. PATENT DOCUMENTS

| | | | |
|---|---|---|---|
| 5,552,655 A * | 9/1996 | Stokes et al. | 310/330 |
| 6,515,558 B1 | 2/2003 | Ylilammi | |
| 6,709,776 B2 * | 3/2004 | Noguchi et al. | 428/702 |
| 6,909,221 B2 * | 6/2005 | Ayazi et al. | 310/321 |
| 6,936,837 B2 * | 8/2005 | Yamada et al. | 257/2 |
| 2002/0134669 A1 | 9/2002 | Molarius et al. | |

(Continued)

FOREIGN PATENT DOCUMENTS

EP    1 304 768 A2    4/2003

(Continued)

OTHER PUBLICATIONS

Strassner M et al: "III-V semiconductor material for tunable Faabry-Perot filters for coarse and dense WDM systems", Sensors and Actuators A, Elsevier Sequoia S.A. Lausanne, CH, vol. 85, No. 1-3, Aug. 25, 2000, pp. 249-255, XP004214479.

*Primary Examiner*—Jack Chen
(74) *Attorney, Agent, or Firm*—Sughrue Mion, PLLC

(57) ABSTRACT

A method of manufacturing a film bulk acoustic resonator and the resonator manufactured thereby. The method includes the laminating a sacrificial layer on a semiconductor substrate, removing a predetermined area from the sacrificial layer to realize electric contact between a signal line of the semiconductor substrate and a lower electrode, forming the lower electrode by depositing metal film for lower electrode on the sacrificial layer, by patterning based on a shape of the sacrificial layer, forming a piezoelectric layer by depositing a piezoelectric material on the lower electrode and by patterning based on a shape of the lower electrode, and forming an upper electrode by depositing metal film on the piezoelectric layer and by patterning based on a shape of the piezoelectric layer, wherein at least one of a deposition pressure and a deposition power is controlled to generate upward stress when depositing the metal film for the lower electrode.

10 Claims, 4 Drawing Sheets

U.S. PATENT DOCUMENTS

| | | |
|---|---|---|
| 2002/0187662 A1 | 12/2002 | Biegelsen et al. |
| 2005/0034822 A1 * | 2/2005 | Kim et al. .................. 159/5 |

FOREIGN PATENT DOCUMENTS

| | | |
|---|---|---|
| JP | 63-177605 A | 7/1988 |
| JP | 63-187713 A | 8/1988 |
| JP | 08-078735 A | 3/1996 |
| JP | 2001-267645 A | 9/2001 |
| JP | 2003-017964 A | 1/2003 |

* cited by examiner

METHOD OF MANUFACTURING FILM BULK ACOUSTIC RESONATOR USING INTERNAL STRESS OF METALLIC FILM AND RESONATOR MANUFACTURED THEREBY

CROSS-REFERENCE TO RELATED APPLICATIONS

This application claims the benefit of Korean Application No. 2003-32651, filed May 22, 2003, in the Korean Intellectual Property Office, the disclosure of which is incorporated herein by reference.

BACKGROUND

1. Field of the Invention

Apparatuses and methods consistent with the present invention relate to a method of manufacturing an acoustic resonator and the resonator manufactured thereby, and in particular, to a method of manufacturing a film bulk acoustic resonator (FBAR) using internal stress of a metallic film and the resonator manufactured thereby.

2. Description of the Related Art

Mobile communication technologies have dramatically developed recently. Mobile communication technologies require various parts of the radio frequency (RF) spectrum that can effectively relay information within a limited frequency band. In particular, a filter among RF parts is one of the core parts used in mobile communication technologies for selecting signals from numerous public waves or filtering the signals to be transmitted as desired by a user, thereby realizing a communication of high quality.

The most commonly used RF filters for mobile communication are a dielectric filter and a surface acoustic wave (SAW) filter. The dielectric filter has advantages of high dielectric constant, low insertion loss, stability at high temperatures and high resistance to vibration and impact. However, the dielectric filter has limitations in minimizing its size and realizing monolithic microwave ICs (MMIC) that are recent trends in technical development.

Meanwhile, the SAW filter has advantages of being smaller than the dielectric filter and realizing easy signal processing as well as being simple in its circuit. The SAW filter can also be manufactured on a large-scale basis. Further, the SAW filter has higher side rejection within the passband than the dielectric filter, thereby realizing an exchange of information of high quality. However, the SAW filtering process includes an exposing process using an ultraviolet layer. Thus, the SAW filter has a limitation to 0.51 µm in its inter-digital transducer (IDT) line width. Accordingly, it is impossible to cover the high radio frequency (higher than 5 GHz) band by using the SAW filter. Moreover, it is fundamentally impossible to construct the SAW filter with an MMIC structure, which is adopted for a semiconductor substrate, and with a single chip.

Suggested to overcome the above limitations and problems was an FBAR filter, which can completely realize the frequency control circuits as an MMIC by being integrated with other active elements on a conventional semiconductor (Si, GaAs) substrate.

The FBAR is a thin film element incurring low manufacturing cost and has a small size with a high quality coefficient. Therefore, the FBAR can be used for mobile communication apparatuses in a broad frequency band (900 MHz~10 GHz) and military radar, etc. The FBAR can also be miniaturized to one several hundredth of the size of the dielectric filter or an LC filter while having a considerably smaller amount of insertion loss than the SAW filter. Thus, the FBAR is highly stable and applicable to MMICs requiring a high quality coefficient.

The FBAR filter is produced by directly depositing ZnO or AlN, which is a piezodielectric material, using radio frequency (RF) sputtering on Si or GaAs, which is a semiconductor substrate so as to induce resonance due to the piezoelectric characteristic. Such FBAR induces bulk acoustic waves by depositing piezoelectric film between two electrodes so as to generate resonance.

FIGS. 1 to 3 show structures of the conventional FBARs.

FIG. 1 shows a structure of an FBAR of the conventional bulk micro machining type. In the FBAR of the bulk micro machining type, a membrane layer is formed through a cavity 16, which is formed by depositing $SiO_2$ 12 on a semiconductor substrate 11 and isotropically etching an opposite surface of the semiconductor substrate 11. A lower part electrode layer 13 is formed on an upper part of the $SiO_2$ 12. A piezoelectric layer 14 is formed by depositing a piezoelectric material on the lower electrode layer 13 by means of RF magnetron sputtering. An upper part electrode layer 15 is formed on the piezoelectric layer 14. The drawing reference numeral 17 represents a resonance structure.

Such FBAR of the bulk micro machining type has advantages of reducing loss of dielectric properties from the semiconductor substrate 11 as well as of electric power because of the cavity 16. However, the FBAR of the bulk micro machining type also has drawbacks in that an element occupies a large area due to the orientation of the semiconductor substrate and a yield rate is deteriorated due to breaking caused by low structural stability in the post packaging process. Recently introduced to overcome such problems of the FBAR of the bulk micro machining type and to simplify the process of manufacturing an element are FBARs of an air gap type and of a Bragg reflector type.

FIG. 2 shows a structure of the FBAR of a Bragg reflector type. The Bragg reflector type FBAR is manufactured by laminating an acoustic reflector 28, which comprises predetermined members 22, 23, 24, on a semiconductor substrate, and laminating a resonance structure 29 on the acoustic reflector 28. In the Bragg reflector type FBAR, a material having a great difference in acoustic impedance is deposited on the semiconductor substrate 21 in separation layers so as to induce Bragg reflection and resonance of acoustic energy between the upper and lower electrode layers 25, 27. The drawing reference numeral 26 represents a piezoelectric layer.

Thus, the advantages of the Bragg reflector type FBAR are that it has a firm structure, incurs less manufacturing time and is highly resistant to external impact. However, it also poses problems in that it is difficult to control the thickness between the layers to realize total reflection and manufacturing cost increases to form a reflection layer for the acoustic reflection 28.

FIG. 3 shows a structure of the FBAR of a surface micro machining type. In the surface micro machining type FBAR, a membrane layer 32 is formed with an air gap 36, which is generated in a sacrificial layer on the semiconductor substrate 31 by using micromachining technology. The drawing reference numerals 32, 33, 34, 35 and 36 respectively represent oxidized silicon film, a lower electrode layer, a piezoelectric layer, an upper electrode layer, and a resonance structure.

The surface micro machining type FBAR serves to reduce a long processing time consumed when etching an opposite surface of the substrate to form the membrane layer as shown in FIG. 1 as well as the danger that might be caused by harmful gas. The surface micro machining type FBAR also has merits of losing less dielectric properties of the semiconductor substrate and being small in its area. However, it has drawbacks of a deteriorating low yield rate and easy breakability in the post process because of long exposure of the structure when etching the sacrificial layer as well as being a complicated manufacturing process.

SUMMARY

Therefore, it is an aspect of the present invention to provide a method of manufacturing a film bulk acoustic resonator and the resonator manufactured thereby through applying external forces when depositing upper/lower electrode layers and generating a stress upward so that the upper/lower electrode layers and piezoelectric layers can be spaced from a semiconductor substrate without requiring a separate supporter or a holder.

It is another aspect of the present invention to provide a method of manufacturing a film bulk acoustic resonator and the resonator manufactured thereby through forming wrinkles in a predetermined area of a lower electrode layer so that a piezoelectric structure can be spaced from a semiconductor substrate to be higher than a predetermined height even by a slight upward stress generated by a small amount of external force.

To achieve the above and other aspects, the present invention provides a method of manufacturing a film bulk acoustic resonator, the method comprising the steps of: laminating a sacrificial layer on an upper surface of a semiconductor substrate; removing a predetermined area from the sacrificial layer to realize electric contact between a signal line of the semiconductor substrate and a lower electrode layer; forming the lower electrode layer by depositing metal film for lower electrode on an upper surface of the sacrificial layer, from which the predetermined area has been removed, and by patterning the same based on a shape of the sacrificial layer; forming a piezoelectric layer by depositing a piezoelectric material on an upper surface of the lower electrode layer and by patterning the same based on a shape of the lower electrode layer; and forming an upper electrode layer by depositing metal film for an upper electrode on an upper surface of the piezoelectric layer and by patterning the same based on a shape of the piezoelectric layer, characterized by controlling at least either a deposition pressure or a deposition power to generate a predetermined amount of upward stress at the time of depositing the metal film for the lower electrode.

The method described above may further comprise a step of forming wrinkles of a predetermined shape by patterning a space between the predetermined area removed from the sacrificial layer and the area, on which the piezoelectric layer is to be laminated.

The wrinkles of a predetermined shape are formed preferably, but not necessarily, to have a cross section of a sawtooth shape and/or of a consecutive half-circular shape.

The method described above may further comprise a step of leading in a predetermined bend prevention groove by patterning the lower electrode layer to form the predetermined bend prevention groove on a portion corresponding to the piezoelectric layer of the upper electrode layer.

To achieve the above and other aspects, the present invention also provides a film bulk acoustic resonator, comprising: a semiconductor substrate; a lower electrode layer formed to have a predetermined area electrically in contact with a signal line of the semiconductor substrate and the other area spaced by a predetermined height from the semiconductor substrate; a piezoelectric layer formed on an upper surface of the other area of the lower electrode layer based on a shape of the lower electrode layer; and an upper electrode layer formed on an upper surface of the piezoelectric layer based on a shape of the piezoelectric layer, characterized by controlling at least either a deposition pressure or a deposition power to generate an upward stress at the time of depositing the upper electrode layer and the lower electrode layer.

The film bulk acoustic resonator according to the present invention needs a simple manufacturing process as it requires no supporter or holder.

BRIEF DESCRIPTION OF THE DRAWINGS

The above and other aspects, features and advantages of the present invention will become more apparent from the following description when taken in conjunction with the accompanying drawings, in which.

DESCRIPTION OF THE EXEMPLARY EMBODIMENTS

Figure 1:
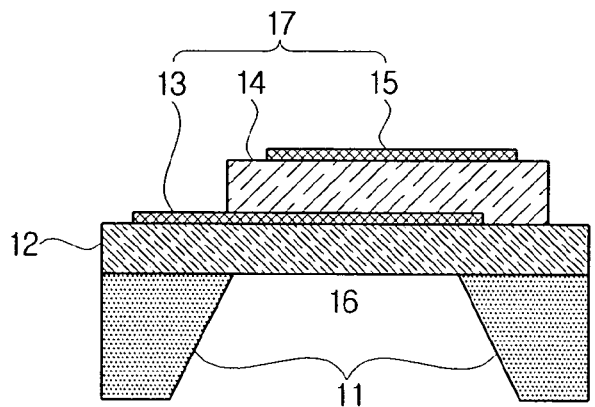
FIG. 1 is a cross-sectional view of an FBAR of a conventional bulk micro machining type.
Figure 2:
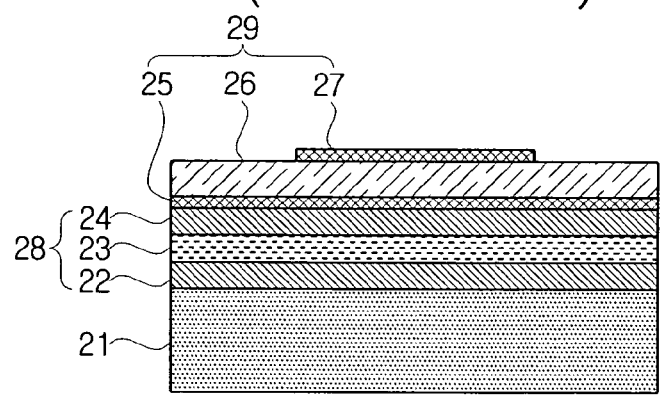
FIG. 2 is a cross-sectional view of an FBAR of a conventional Bragg reflector type.
Figure 3:
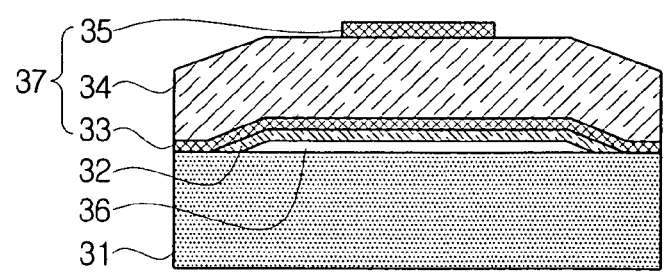
FIG. 3 is a cross-sectional view of an FBAR of a conventional air gap type.

Exemplary embodiments of the present invention will be described below with reference to the accompanying drawings. In the following description, well-known functions or constructions are not described.

FIGS. 4A to 4F are diagrams illustrating a series of a manufacturing process according to an exemplary example of the present invention.

For descriptive convenience, the structure comprising upper/lower electrode layers 120, 140 and a piezoelectric layer 130 formed in the process below will be referred to a piezo-resonance structure 150. Based on that definition, description will now be made by dividing the piezo-resonance structure 150 into three areas, i.e., a conductive area A, a resonance area C, and a supporting area B.

The conductive area A is an area, in which the piezo-resonance structure 150 is electrically in contact with a signal line (not shown) of the semiconductor substrate 100. The upper/lower electrode layers 120, 140 and the piezoelectric layer 130 are laminated in the resonance area C. If an electric signal is applied to the upper/lower electrode layers 120, 140 in the resonance area C, piezoelectricity is generated in the piezoelectric layer 130 between the upper electrode layer 120 and the lower electrode layer 140. As a consequence, resonance is generated within a predetermined frequency band. The supporting area B is an area linking the conductive area A to the resonance area C and supporting the resonance area C so as to be spaced from the semiconductor substrate 100 by a predetermined distance.

Figure 4A:
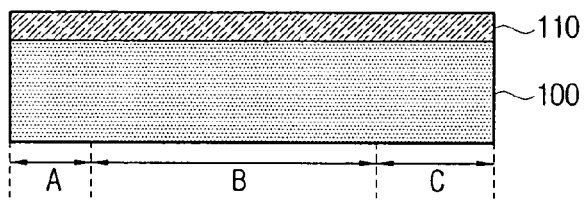
FIGS. 4A to 4F are diagrams illustrating a series of a manufacturing process of an FBAR according to an example of the present invention.

In the process shown in FIG. 4A, a sacrificial layer 110 is deposited on an upper surface of the semiconductor substrate 100. The semiconductor substrate 100 may be composed of a conventional silicon wafer, glass, fused silica, quartz, ceramic or a high resistance silicon substrate (HRS). The thickness of the sacrificial layer 110 is related to that of an air gap, which will be described later. Therefore, the thickness of the sacrificial layer 110 should be determined in consideration of the thickness of the air gap.

Figure 4B:
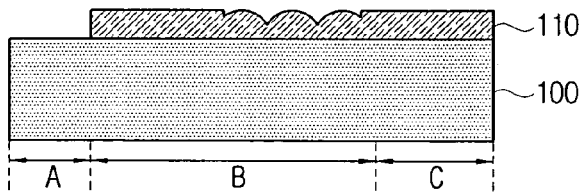

In the process shown in FIG. 4B, the conductive area A of the sacrificial layer 110 deposited on the semiconductor substrate 100 is removed by means of a photolithographic process. Such a process is performed for the electric contact of the signal line (not shown) of the semiconductor substrate 100 with the lower electrode layer 120, which will be described later. Wrinkles of a predetermined shape are formed in the supporting area B by means of the photolithographic process. The wrinkles may be of diverse shapes, and preferably, but not necessarily, of consecutive half circular shapes as shown in FIG. 4B. Although the photolithographic process has been exemplified as the patterning process in the present specification, the present invention is not limited thereto.

Figure 4C:
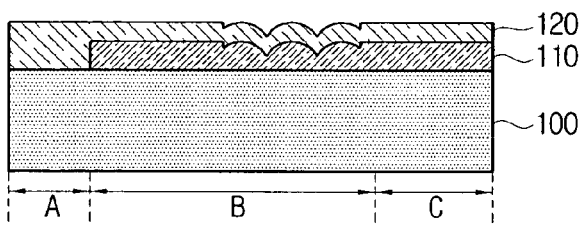

In the process shown in FIG. 4C, a metallic film for the lower electrode is deposited over the entire areas A, B and C of the sacrificial layer 110 to form the lower electrode layer 120. Thereafter, patterning is performed in accordance with the shape of the sacrificial layer 110. In the course of depositing the metallic film of the lower electrode, external forces such as depositing pressure and depositing power are controlled so as to increase by a predetermined amount. The reason for such control is for generating a stress upward in resistance to the external forces laid on the metallic film for the lower electrode.

The conductive area A in the metallic film for the lower electrode is electrically conducted by being directly in contact with the signal line (not shown) of the semiconductor substrate 100 in the process shown in FIG. 4B. Ordinary conductive material is used for the metallic film for the lower electrode. Preferably, but not necessarily, any one metal may be selected from Al, W, Au, Pt, Ni, Ti, Cr, Pd or Mo. For deposition, RF magnetron sputtering or evaporation may be used.

Figure 4D:
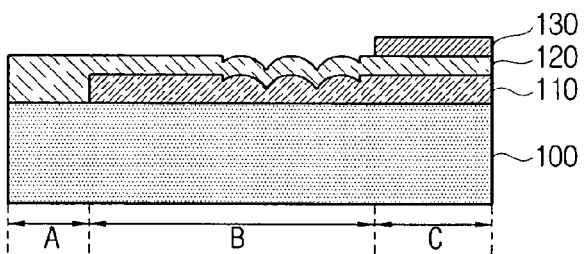

In the process shown in FIG. 4D, the piezoelectric layer 130 is formed by depositing and patterning a piezoelectric material in the resonance area C on the surface of the lower electrode layer 120. If an electric signal is applied to the piezoelectric layer 130, piezoelectricity is generated to convert the electric signal to a mechanical energy of an acoustic wave shape. Either AlN or ZnO is generally but not necessarily used as a piezoelectric material to form the piezoelectric layer 130. Preferably, but not necessarily, Rf magnetron sputtering is used for depositing the piezoelectric layer 130.

Figure 4E:
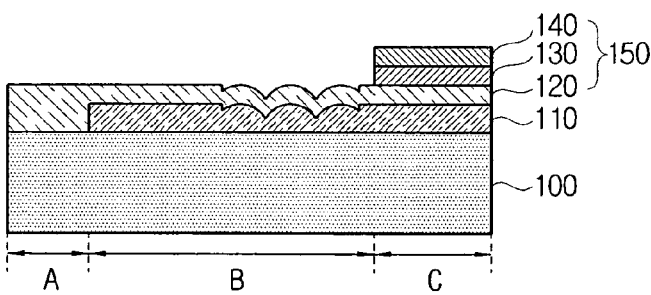

In the process shown in FIG. 4E, metallic film for an upper electrode is deposited on an upper part of the piezoelectric layer 130, and patterning is performed to form the upper electrode layer 140. The same kind of metallic film and the same deposition manner as described for the lower electrode layer 120 may be, but not necessarily, used for the upper electrode layer 140. Further, as in a case of forming the lower electrode layer, external forces such as deposition pressure and deposition power are controlled to increase by a predetermined amount.

Figure 4F:
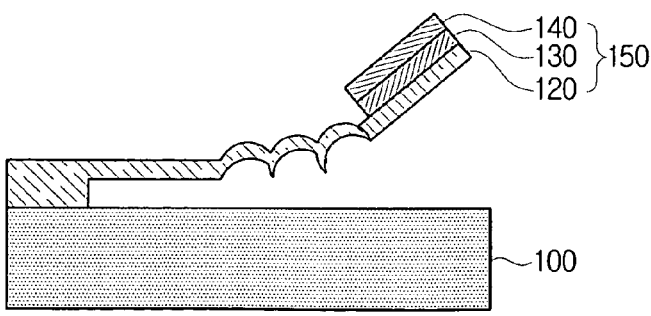

In the process shown in FIG. 4F, the sacrificial layer 110 is removed by etching, and an air gap is formed between the semiconductor substrate 100 and the piezoelectric resonance structure 150 so that the semiconductor substrate 100 cannot be affected by the acoustic wave from the piezoelectric layer 130. Wet etching or dry etching may be used for etching the sacrificial layer 110.

The piezoelectric resonance structure 150 is formed through the above process as shown in FIG. 4F. The piezoelectric resonance structure 150 in the conductive area A is electrically in contact with the signal line 260 (FIG. 5) of the semiconductor substrate 100. The upward stress generated in resistance to a predetermined amount of external forces bends the supporting area B and the resonance area C upward. As a consequence, the resonance area C of the piezoelectric resonance structure 150 is spaced from the semiconductor substrate 100 by a predetermined distance.

Figure 5:
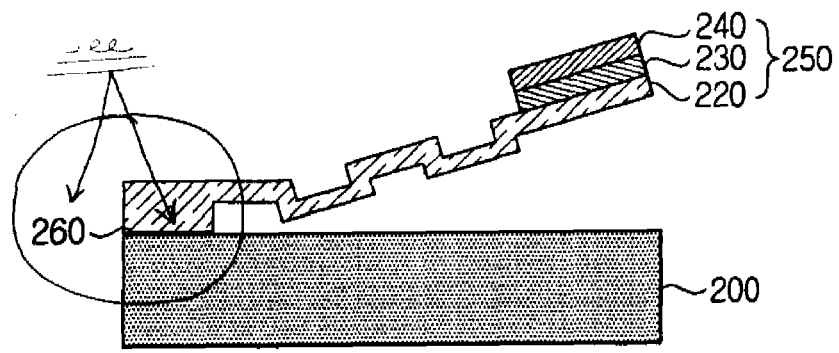
FIG. 5 is a cross-sectional view of an FBAR according to another embodiment of the present invention.

FIG. 5 is a cross-sectional view of an FBAR according to another exemplary embodiment of the present invention. In particular, the FBAR in FIG. 5 is distinguished from the FBAR shown in FIGS. 4A to 4F in that the wrinkles in the supporting area B are of a sawtooth shape.

The reason for forming the wrinkles of a predetermined shape as shown in FIGS. 4F and 5 will now be explained. In order to space a piezoelectric resonance structure 250 comprising an upper/lower electrode layers 220, 240 and a piezoelectric layer 230 from a semiconductor substrate 200, deposition pressure and deposition power are controlled to increase when depositing the upper/lower electrode layers 220, 240 because the deposition pressure and the deposition power are related to stress. When the deposition pressure and the deposition power have been so controlled, performance of the piezoelectric resonance structure 250 may deteriorate due to the stress. Accordingly, it is necessary to space the resonance area C from the semiconductor substrate 200 by a predetermined distance even if an internal stress of the metallic film is small. One of the spacing measures is to form wrinkles of a predetermined shape in the supporting area B. By doing so, the height of the resonance area C to be spaced from the semiconductor substrate 200 can be increased by a small amount of deposition pressure and deposition power.

Figure 6:
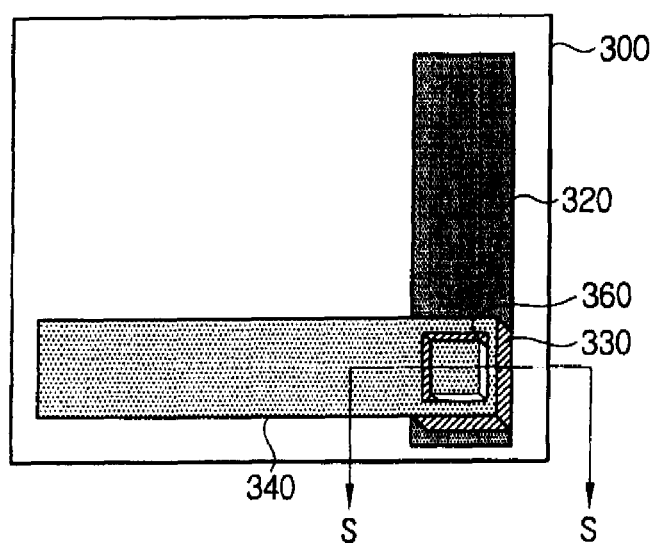
FIG. 6 is a top-plan view of the FBAR according to the present invention.
Figure 7A:
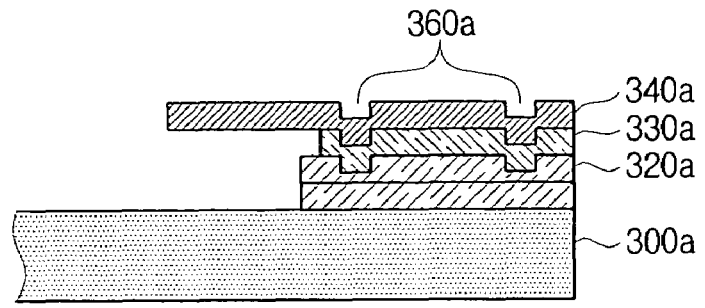
FIGS. 7A to 7C are cross-sectional views magnifying the area S in FIG. 6 according to the exemplary embodiments of the present invention.
Figure 7B:
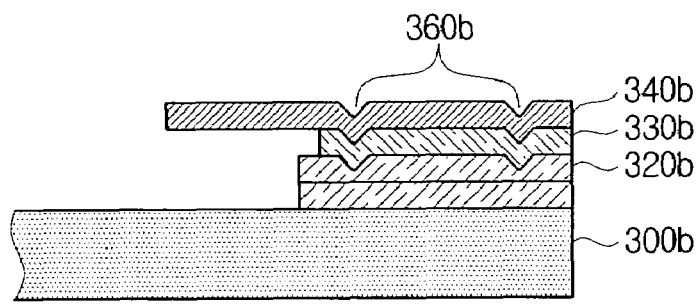
Figure 7C:
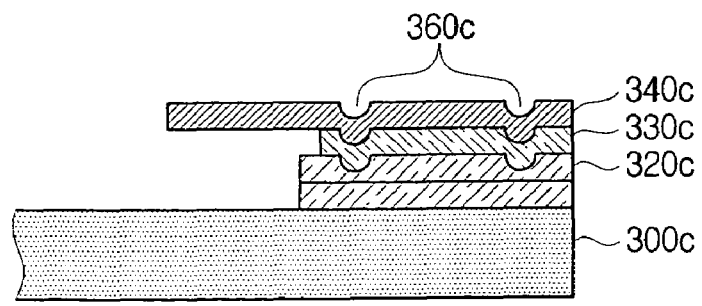

FIG. 6 is a top plan view of the FBAR according to the present invention. FIGS. 7A to 7C are cross-sectional views of the area S in FIG. 6 illustrating exemplary embodiments of the bend prevention groove.

FIG. 6 is a top plan view exemplifying a case of additionally forming predetermined bend prevention groove 360 in the resonance area C in the course of patterning the lower electrode layer 320 in FIG. 4C. Once the predetermined lead-in bend prevention groove 360 have been formed on a portion of the lower electrode layer corresponding to the piezoelectric layer 330, the upper electrode layer 340 and the piezoelectric layer 330 are patterned in FIGS. 4D and 4E based on the piezoelectric layer 330 and the lower electric layer 320. As a consequence, the bend prevention groove of the same shape as that of the lower electrode layer 320 is provided on an upper surface of the upper electrode layer 340.

Here, the reason for forming the predetermined bend prevention groove will be explained. When the metallic film for the upper electrode and for the lower electrode have been controlled to increase the deposition pressure and deposition power in the process shown in FIG. 4C, not only the supporting area B but also the resonance area C itself may be bent upward due to an upward stress. In that case, the upward bend of the resonance area C itself deteriorates the performance of the piezoelectric resonance structure. Hence, the bend prevention groove needs to be formed to prevent bending of the resonance area C itself.

The cross section of the bend prevention groove may be patterned in diverse shapes. FIG. 7A shows a rectangular shape, and FIG. 7B shows a reversed triangular shape, while FIG. 7C shows a circular shape. However, the present invention is not limited to the exemplified shapes of the cross section. The drawing reference numerals 300a, 300b, 300c represent semiconductor substrates; 320*a*, 320*b*, 320*c* represent lower electrode layers; 330*a*, 330*b*, 330*c* represent piezoelectric layers; 340*a*, 340*b*, 340*c* represent upper electrode layers; and 360*a*, 360*b*, 360*c* represent bend prevention grooves.

The method of manufacturing the film bulk acoustic resonator according to the present invention is capable of sufficiently spacing the upper/lower electrode layers and the piezoelectric layer from the semiconductor substrate by applying external forces when depositing the lower electrode layer and by subsequently generating an upward stress. The method is also capable of spacing the piezoelectric resonance structure to be higher than a predetermined height by a small amount of stress generated from slight external forces by forming wrinkles in a predetermined area of the lower electrode layer.

As a consequence, the film bulk acoustic resonator according to the present invention does not necessitate a supporter, which is required to space the piezoelectric layer from the substrate in the conventional resonator. Thus, the manufacturing process is relatively simple. In spite of the simplified manufacturing process, the film bulk acoustic resonator according to the present invention has advantages in that the periphery of the piezoelectric layer is surrounded by an air layer as in the case of the conventional FBAR, and that a CMOS process can also be employed at the same time because the process of etching the lower substrate is not required.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A film bulk acoustic resonator comprising:
    a semiconductor substrate;
    a lower electrode layer having a predetermined first area electrically in contact with a signal line of the semiconductor substrate and another second area spaced by a predetermined height from the semiconductor substrate, the second area being disposed above the semiconductor substrate, the semiconductor substrate being continuously present in the second area;
    a piezoelectric layer formed on an upper surface of the another second area of the lower electrode layer based on a shape of the lower electrode layer; and
    an upper electrode layer formed on an upper surface of the piezoelectric layer based on a shape of the piezoelectric layer,
    wherein at least one of a deposition pressure and a deposition power is controlled to generate an upward stress when depositing the upper electrode layer and the lower electrode layer, and
    wherein the lower electrode layer, the piezoelectric layer and the upper electrode layer are provided with a pre-generated upward stress.

2. The film bulk acoustic resonator of claim 1, wherein wrinkles of a predetermined shape are formed on the lower electrode layer at a third area between the predetermined first area and the another second area, on which the piezoelectric layer is to be laminated.

3. The film bulk acoustic resonator of claim 2, wherein a cross section of the wrinkles of a predetermined shape is either of a sawtooth shape or of a consecutive half-circular shape.

4. The film bulk acoustic resonator of claim 1, wherein a predetermined bend prevention groove is formed on a portion of the upper electrode layer corresponding to the piezoelectric layer.

5. The film bulk acoustic resonator of claim 1, wherein a predetermined lead-in bend prevention groove is formed on a portion of the lower electrode layer corresponding to the piezoelectric layer.

6. The film bulk acoustic resonator of claim 1, wherein the lower electrode layer has a cantilever shape.

7. The film bulk acoustic resonator of claim 1, wherein the first area and the second area are non-overlapping.

8. The film bulk acoustic resonator of claim 4, wherein the second area of the lower electrode layer is unsupported and is not in contact with the semiconductor substrate.

9. The film bulk acoustic resonator of claim 6, wherein the first area is in contact with the semiconductor substrate.

10. The film bulk acoustic resonator of claim 1, wherein a lower surface of the second area and a top surface of the semiconductor substrate form an air gap.

* * * * *